(12) United States Patent  
Zheng et al.

(10) Patent No.: US 12,077,099 B2  
(45) Date of Patent: Sep. 3, 2024

(54) STATUS DETECTION METHOD AND DEVICE FOR VEHICLE LIGHT SIGNALING CONTROL DEVICE, AND VEHICLE

(71) Applicant: NIO TECHNOLOGY (ANHUI) CO., LTD, Hefei (CN)

(72) Inventors: Jiawen Zheng, Shanghai (CN); Lin Mu, Shanghai (CN); Lv Li, Shanghai (CN); Rui Zhang, Shanghai (CN); Xihan Zhang, Shanghai (CN)

(73) Assignee: NIO TECHNOLOGY (ANHUI) CO., LTD, Hefei (CN)

( * ) Notice: Subject to any disclaimer, the term of this patent is extended or adjusted under 35 U.S.C. 154(b) by 402 days.

(21) Appl. No.: 17/487,077

(22) Filed: Sep. 28, 2021

(65) Prior Publication Data

US 2022/0097604 A1  Mar. 31, 2022

(30) Foreign Application Priority Data

Sep. 29, 2020 (CN) .......................... 202011054979.2

(51) Int. Cl.
| | |
|---|---|
| *B60Q 1/00* | (2006.01) |
| *B60Q 11/00* | (2006.01) |
| *G01D 5/16* | (2006.01) |
| *G07C 5/08* | (2006.01) |

(52) U.S. Cl.
CPC .............. *B60Q 11/007* (2013.01); *G01D 5/16* (2013.01); *G07C 5/0816* (2013.01)

(58) Field of Classification Search
CPC ...... B60Q 11/007; B60Q 1/1461; G01D 5/16; G07C 5/0816; G01R 27/02; G01R 31/007;

(Continued)

(56) References Cited

U.S. PATENT DOCUMENTS 4,195,281 A * 3/1980 Bell ..................... B60Q 11/005  
  315/136  
4,315,196 A * 2/1982 Kitayama .............. H05B 47/21  
  315/132

(Continued)

FOREIGN PATENT DOCUMENTS

DE 102009038567 A1 * 2/2011 ............. B60Q 1/343  
JP 2020167162 A * 10/2020 ............... B60Q 1/00

OTHER PUBLICATIONS

JP-2020167162-A English translation (Year: 2020).*  
DE-102009038567-A1 English translation (Year: 2009).*

*Primary Examiner* — Angelina M Shudy  
(74) *Attorney, Agent, or Firm* — Sheridan Ross P.C.

(57) ABSTRACT

The invention relates to the technical field of device detection, and in particular provides a status detection method and device for a vehicle light signaling control device, and a vehicle, so as solve a technical problem of how to accurately and reliably detect an operating status of a vehicle light signaling control device. For this purpose, according to the method of an embodiment of the invention, a first resistance jump sequence of a currently detected position resistance may be obtained according to historical position resistance data and the currently detected position resistance; and then it is determined whether the vehicle light signaling control device has malfunctioned, according to a comparison result of the first resistance jump sequence and a preset second resistance jump sequence. By means of the foregoing steps, when a jump sequence of the position resistance is consistent with a normal resistance jump sequence, it may be determined that an actual position of a turn position shifting module is a position corresponding to this position resistance, which overcomes a defect of false position determination in the prior art caused by the inconsistency between (Continued)

a position corresponding to a resistance value detection result and an actual position of a light control lever.

10 Claims, 1 Drawing Sheet

(58) Field of Classification Search
CPC ... G01R 31/3277; H01H 71/04; B60W 50/00; G05D 1/00
See application file for complete search history.

(56) References Cited

U.S. PATENT DOCUMENTS

| | | | | |
|---|---|---|---|---|
| 4,745,339 | A * | 5/1988 | Izawa | H01L 29/0847 |
| | | | | 315/129 |
| 5,561,416 | A * | 10/1996 | Marshall | F16H 59/105 |
| | | | | 477/906 |
| 5,912,617 | A * | 6/1999 | Poletto | H03K 17/945 |
| | | | | 73/304 R |
| 10,271,411 | B2 * | 4/2019 | Troutman | B60Q 11/005 |
| 10,534,036 | B2 * | 1/2020 | Yan | H02J 9/06 |
| 11,169,209 | B2 * | 11/2021 | Mueller | H01H 9/54 |
| 11,919,441 | B2 * | 3/2024 | Nakayama | B60Q 1/382 |
| 2010/0270937 | A1 * | 10/2010 | Zhang | H05B 41/282 |
| | | | | 315/224 |
| 2013/0241311 | A1 * | 9/2013 | Iwanabe | H04L 1/0082 |
| | | | | 307/112 |
| 2017/0021696 | A1 * | 1/2017 | Nagasaka | B60H 1/2218 |
| 2017/0072854 | A1 * | 3/2017 | Cornelius | B60Q 11/005 |
| 2018/0001744 | A1 * | 1/2018 | Vehr | B60H 1/005 |

\* cited by examiner

STATUS DETECTION METHOD AND DEVICE FOR VEHICLE LIGHT SIGNALING CONTROL DEVICE, AND VEHICLE

CROSS-REFERENCE TO RELATED APPLICATION

This application claims the benefit of China Patent Application No. 202011054979.2 filed Sep. 29, 2020, the entire contents of which are incorporated herein by reference in its entirety.

TECHNICAL FIELD

The invention relates to the technical field of device detection, and in particular to a status detection method and device for a vehicle light signaling control device, and a vehicle.

BACKGROUND ART

A vehicle turn signaling control device is a device that is switched on to call attention of vehicles and pedestrians in the front, back, left, and right when a vehicle makes a turn, and the device mainly includes turn signals and a light control lever. Shifting the light control lever to different positions (a left turn position, a right turn position, and an off position) can switch on the turn signals to different directions, so as to call attention of the vehicles/pedestrians. For example, when the light control lever is shifted to the left turn position, a turn signal on the left side of the vehicle is switched on, warning the vehicles/pedestrians that the vehicle is about to turn left. A current conventional light control lever position detection method is detecting a resistance value of a light control lever, determining a resistance interval of which position the resistance value falls into, and determining a position of the light control lever according to a determination result. However, in practical applications, due to poor contact of components and other factors, it may happen that although a resistance value of the light control lever is detected to fall into a resistance interval of a specific position, an actual position of the light control lever is different from this position. For example, the actual position of the light control lever is the left turn position (the turn signal on the left side of the vehicle is switched on). A user does not shift a position, but it is detected that the resistance value of the light control lever falls into a resistance interval of the right turn position, which causes the turn signal on the right side of the vehicle to be switched on, and consequently increases the driving risk of the vehicle.

SUMMARY OF THE INVENTION

In order to overcome the above defects, the invention is proposed to provide a status detection method and device for a vehicle light signaling control device, and a vehicle, so as to solve or at least partially solve a technical problem of how to accurately and reliably detect an operating status of a vehicle light signaling control device, such as a turn signaling control device.

According to a first aspect, there is provided a status detection method for a vehicle light signaling control device, where the vehicle light signaling control device includes a turn position shifting module configured to perform on/off control on left turn signaling and right turn signaling by means of position shifting, and output a position resistance corresponding to a shifted position after the position shifting; and the status detection method includes:

after it is detected that the position resistance output by the turn position shifting module is a preset position resistance of a turn signaling on position or a preset position resistance of a turn signaling off position, obtaining a first resistance jump sequence of a currently detected position resistance according to historical position resistance data and the currently detected position resistance; and determining whether the vehicle light signaling control device has malfunctioned, according to a comparison result of the first resistance jump sequence and a preset second resistance jump sequence, where the preset second resistance jump sequence is a resistance jump sequence obtained according to a position resistance corresponding to each position in a preset position shifting sequence.

In a technical solution of the foregoing status detection method, the step of "obtaining a first resistance jump sequence of a currently detected position resistance according to historical position resistance data and the currently detected position resistance" specifically includes:

obtaining, according to the historical position resistance data, a position resistance output by the turn position shifting module before the position resistance jumps to the currently detected position resistance; and obtaining the first resistance jump sequence according to the obtained position resistance and the currently detected position resistance.

In a technical solution of the foregoing status detection method, the step of "determining whether the vehicle light signaling control device has malfunctioned, according to a comparison result of the first resistance jump sequence and a preset second resistance jump sequence" specifically includes:

if the first resistance jump sequence is consistent with the second resistance jump sequence, determining that the vehicle light signaling control device has not malfunctioned; or if the first resistance jump sequence is inconsistent with the second resistance jump sequence, determining that the vehicle light signaling control device has malfunctioned, and outputting malfunction warning information.

In a technical solution of the foregoing status detection method, the method further includes:

determining whether the position resistance output by the turn position shifting module is a preset abnormal resistance; and if the position resistance output by the turn position shifting module is a preset abnormal resistance, determining that the vehicle light signaling control device has malfunctioned, and outputting malfunction warning information, where the preset abnormal resistance includes a resistance value other than the preset position resistance of the turn signaling on position and the preset position resistance of the turn signaling off position.

In a technical solution of the foregoing status detection method, after the determining that the vehicle light signaling control device has malfunctioned, the method further includes a malfunction removal determining step, and the malfunction removal determining step specifically includes:

collecting a position resistance output by the turn position shifting module, and obtaining a third resistance jump sequence of the position resistance based on a collection result; and determining whether the malfunction of the vehicle light signaling control device is to be removed, according to a comparison result of the third resistance jump sequence and a preset fourth resistance jump sequence, where the preset fourth resistance jump sequence is a sequential jump sequence according to position resistances corresponding to one turn signaling on position, the turn signaling off position, and the other turn signaling on position.

In a technical solution of the foregoing status detection method, the step of "determining whether the malfunction of the vehicle light signaling control device is to be removed, according to a comparison result of the third resistance jump sequence and a preset fourth resistance jump sequence" specifically includes:

if the third resistance jump sequence is consistent with the fourth resistance jump sequence, determining that the malfunction of the vehicle light signaling control device is to be removed, and stopping sending the malfunction warning information; or if the third resistance jump sequence is inconsistent with the fourth resistance jump sequence, continuing outputting the malfunction warning information.

In a technical solution of the foregoing status detection method, before the malfunction removal determining step is performed, the method further includes:

obtaining the number of times it is determined that the vehicle light signaling control device has malfunctioned within a preset detection period;

determining whether the number of times is greater than or equal to a preset threshold of times; and if the number of times is greater than or equal to the preset threshold of times, skipping the malfunction removal determining step; or if the number of times is less than the preset threshold of times, performing the malfunction removal determining step.

In a technical solution of the foregoing status detection method, the preset position shifting sequence includes a sequence of shifting from the turn signaling off position to the turn signaling on position, and/or a sequence of shifting from the turn signaling on position to the turn signaling off position, and/or the preset position shifting sequence includes a sequential shifting sequence according to one turn signaling on position, the turn signaling off position, and the other turn signaling on position.

According to a second aspect, there is provided a status detection device for a vehicle light signaling control device, where the vehicle light signaling control device includes a turn position shifting module configured to perform on/off control on left turn signaling and right turn signaling by means of position shifting, and output a position resistance corresponding to a shifted position after the position shifting; and the status detection device includes:

a resistance jump sequence obtaining module configured to: after it is detected that the position resistance output by the turn position shifting module is a preset position resistance of a turn signaling on position or a preset position resistance of a turn signaling off position, obtain a first resistance jump sequence of a currently detected position resistance according to historical position resistance data and the currently detected position resistance; and a first malfunction determining module configured to determine whether the vehicle light signaling control device has malfunctioned, according to a comparison result of the first resistance jump sequence and a preset second resistance jump sequence, where the preset second resistance jump sequence is a resistance jump sequence obtained according to a position resistance corresponding to each position in a preset position shifting sequence.

In a technical solution of the foregoing status detection device, the resistance jump sequence obtaining module is further configured to perform the following operations:

obtaining, according to the historical position resistance data, a position resistance output by the turn position shifting module before the position resistance jumps to the currently detected position resistance; and obtaining the first resistance jump sequence according to the obtained position resistance and the currently detected position resistance.

In a technical solution of the foregoing status detection device, the first malfunction determining module is further configured to perform the following operation:

if the first resistance jump sequence is consistent with the second resistance jump sequence, determining that the vehicle light signaling control device has not malfunctioned; or if the first resistance jump sequence is inconsistent with the second resistance jump sequence, determining that the vehicle light signaling control device has malfunctioned, and outputting malfunction warning information.

In a technical solution of the foregoing status detection device, the status detection device further includes a second malfunction determining module configured to: determine whether the position resistance output by the turn position shifting module is a preset abnormal resistance; and if the position resistance output by the turn position shifting module is a preset abnormal resistance, determine that the vehicle light signaling control device has malfunctioned, and output malfunction warning information, where the preset abnormal resistance includes a resistance value other than the preset position resistance of the turn signaling on position and the preset position resistance of the turn signaling off position.

In a technical solution of the foregoing status detection device, the status detection device further includes a third malfunction determining module configured to: after the first malfunction determining module or the second malfunction determining module determines that the vehicle light signaling control device has malfunctioned, perform the following operations:

collecting a position resistance output by the turn position shifting module, and obtaining a third resistance jump sequence of the position resistance based on a collection result; and determining whether the malfunction of the vehicle light signaling control device is to be removed, according to a comparison result of the third resistance jump sequence and a preset fourth resistance jump sequence, where the preset fourth resistance jump sequence is a sequential jump sequence according to position resistances corresponding to one turn signaling on position, the turn signaling off position, and the other turn signaling on position.

In a technical solution of the foregoing status detection device, the third malfunction determining module is further configured to perform the following operation:

if the third resistance jump sequence is consistent with the fourth resistance jump sequence, determining that the malfunction of the vehicle light signaling control device is to be removed, and stopping sending the malfunction warning information; or if the third resistance jump sequence is inconsistent with the fourth resistance jump sequence, continuing outputting the malfunction warning information.

In a technical solution of the foregoing status detection device, the device further includes an activation control module for the third malfunction determining module, where the activation control module for the third malfunction determining module is configured to: obtain the number of times it is determined that the vehicle light signaling control device has malfunctioned within a preset detection period; determine whether the number of times is greater than or equal to a preset threshold of times; and if the number of times is greater than or equal to the preset threshold of times, skip activating the third malfunction determining module; or if the number of times is less than the preset threshold of times, activate the third malfunction determining module.

In a technical solution of the foregoing status detection device, the preset position shifting sequence includes a sequence of shifting from the turn signaling off position to the turn signaling on position, and/or a sequence of shifting from the turn signaling on position to the turn signaling off position, and/or the preset position shifting sequence includes a sequential shifting sequence according to one turn signaling on position, the turn signaling off position, and the other turn signaling on position.

According to a third aspect, there is provided a status detection device for a vehicle light signaling control device, the status detection device including a processor and a storage device adapted to store a plurality of program codes, where the program codes are adapted to be loaded and run by the processor to perform the status detection method for a vehicle light signaling control device according to any one of the technical solutions of the foregoing status detection method.

According to a fourth aspect, there is provided a storage device having a plurality of program codes stored thereon, where the program codes are adapted to be loaded and run by a processor to perform the status detection method for a vehicle light signaling control device according to any one of the technical solutions of the foregoing status detection method.

According to a fifth aspect, there is provided a vehicle, where the vehicle includes a vehicle light signaling control device and the status detection device for a vehicle light signaling control device according to any one of the technical solutions of the foregoing status detection device;

the vehicle light signaling control device includes a turn position shifting module configured to perform on/off control on left turn signaling and right turn signaling by means of position shifting, and output a position resistance corresponding to a shifted position after the position shifting; and the status detection device is configured to determine whether the vehicle light signaling control device has malfunctioned, according to the position resistance output by the turn position shifting module.

Solution 1: A status detection method for a vehicle light signaling control device, where the vehicle light signaling control device includes a turn position shifting module configured to perform on/off control on left turn signaling and right turn signaling by means of position shifting, and output a position resistance corresponding to a shifted position after the position shifting; and the status detection method includes:

after it is detected that the position resistance output by the turn position shifting module is a preset position resistance of a turn signaling on position or a preset position resistance of a turn signaling off position, obtaining a first resistance jump sequence of a currently detected position resistance according to historical position resistance data and the currently detected position resistance; and determining whether the vehicle light signaling control device has malfunctioned, according to a comparison result of the first resistance jump sequence and a preset second resistance jump sequence, where the preset second resistance jump sequence is a resistance jump sequence obtained according to a position resistance corresponding to each position in a preset position shifting sequence.

Solution 2: The status detection method for a vehicle light signaling control device according to solution 1, where the step of "obtaining a first resistance jump sequence of a currently detected position resistance according to historical position resistance data and the currently detected position resistance" specifically includes:

obtaining, according to the historical position resistance data, a position resistance output by the turn position shifting module before the position resistance jumps to the currently detected position resistance; and obtaining the first resistance jump sequence according to the obtained position resistance and the currently detected position resistance.

Solution 3: The status detection method for a vehicle light signaling control device according to solution 1, where the step of "determining whether the vehicle light signaling control device has malfunctioned, according to a comparison result of the first resistance jump sequence and a preset second resistance jump sequence" specifically includes:

if the first resistance jump sequence is consistent with the second resistance jump sequence, determining that the vehicle light signaling control device has not malfunctioned; or if the first resistance jump sequence is inconsistent with the second resistance jump sequence, determining that the vehicle light signaling control device has malfunctioned, and outputting malfunction warning information.

Solution 4: The status detection method for a vehicle light signaling control device according to solution 1, where the method further includes:

determining whether the position resistance output by the turn position shifting module is a preset abnormal resistance; and if the position resistance output by the turn position shifting module is a preset abnormal resistance, determining that the vehicle light signaling control device has malfunctioned, and outputting malfunction warning information, where the preset abnormal resistance includes a resistance value other than the preset position resistance of the turn signaling on position and the preset position resistance of the turn signaling off position.

Solution 5: The status detection method for a vehicle light signaling control device according to solution 3 or 4, where after the determining that the vehicle light signaling control device has malfunctioned, the method further includes a malfunction removal determining step, and the malfunction removal determining step specifically includes:

collecting a position resistance output by the turn position shifting module, and obtaining a third resistance jump sequence of the position resistance based on a collection result; and determining whether the malfunction of the vehicle light signaling control device is to be removed, according to a comparison result of the third resistance jump sequence and a preset fourth resistance jump sequence, where the preset fourth resistance jump sequence is a sequential jump sequence according to position resistances corresponding to one turn signaling on position, the turn signaling off position, and the other turn signaling on position.

Solution 6: The status detection method for a vehicle light signaling control device according to solution 5, where the step of "determining whether the malfunction of the vehicle light signaling control device is to be removed, according to a comparison result of the third resistance jump sequence and a preset fourth resistance jump sequence" specifically includes:

if the third resistance jump sequence is consistent with the fourth resistance jump sequence, determining that the malfunction of the vehicle light signaling control device is to be removed, and stopping sending the malfunction warning information; or if the third resistance jump sequence is inconsistent with the fourth resistance jump sequence, continuing outputting the malfunction warning information.

Solution 7: The status detection method for a vehicle light signaling control device according to solution 5, where before the malfunction removal determining step is performed, the method further includes:

obtaining the number of times it is determined that the vehicle light signaling control device has malfunctioned within a preset detection period;

determining whether the number of times is greater than or equal to a preset threshold of times; and if the number of times is greater than or equal to the preset threshold of times, skipping the malfunction removal determining step; or if the number of times is less than the preset threshold of times, performing the malfunction removal determining step.

Solution 8: The status detection method for a vehicle light signaling control device according to any one of solutions 1 to 4, where the preset position shifting sequence includes a sequence of shifting from the turn signaling off position to the turn signaling on position, and/or a sequence of shifting from the turn signaling on position to the turn signaling off position, and/or the preset position shifting sequence includes a sequential shifting sequence according to one turn signaling on position, the turn signaling off position, and the other turn signaling on position.

Solution 9: A status detection device for a vehicle light signaling control device, where the vehicle light signaling control device includes a turn position shifting module configured to perform on/off control on left turn signaling and right turn signaling by means of position shifting, and output a position resistance corresponding to a shifted position after the position shifting; and the status detection device includes:

a resistance jump sequence obtaining module configured to: after it is detected that the position resistance output by the turn position shifting module is a preset position resistance of a turn signaling on position or a preset position resistance of a turn signaling off position, obtain a first resistance jump sequence of a currently detected position resistance according to historical position resistance data and the currently detected position resistance; and a first malfunction determining module configured to determine whether the vehicle light signaling control device has malfunctioned, according to a comparison result of the first resistance jump sequence and a preset second resistance jump sequence, where the preset second resistance jump sequence is a resistance jump sequence obtained according to a position resistance corresponding to each position in a preset position shifting sequence.

Solution 10: The status detection device for a vehicle light signaling control device according to solution 9, where the resistance jump sequence obtaining module is further configured to perform the following operations:

obtaining, according to the historical position resistance data, a position resistance output by the turn position shifting module before the position resistance jumps to the currently detected position resistance; and obtaining the first resistance jump sequence according to the obtained position resistance and the currently detected position resistance.

Solution 11: The status detection device for a vehicle light signaling control device according to solution 9, where the first malfunction determining module is further configured to perform the following operation:

if the first resistance jump sequence is consistent with the second resistance jump sequence, determining that the vehicle light signaling control device has not malfunctioned; or if the first resistance jump sequence is inconsistent with the second resistance jump sequence, determining that the vehicle light signaling control device has malfunctioned, and outputting malfunction warning information.

Solution 12: The status detection device for a vehicle light signaling control device according to solution 9, where the status detection device further includes a second malfunction determining module configured to: determine whether the position resistance output by the turn position shifting module is a preset abnormal resistance; and if the position resistance output by the turn position shifting module is a preset abnormal resistance, determine that the vehicle light signaling control device has malfunctioned, and output malfunction warning information, where the preset abnormal resistance includes a resistance value other than the preset position resistance of the turn signaling on position and the preset position resistance of the turn signaling off position.

Solution 13: The status detection device for a vehicle light signaling control device according to solution 11 or 12, where the status detection device further includes a third malfunction determining module configured to: after the first malfunction determining module or the second malfunction determining module determines that the vehicle light signaling control device has malfunctioned, perform the following operations:

collecting a position resistance output by the turn position shifting module, and obtaining a third resistance jump sequence of the position resistance based on a collection result; and determining whether the malfunction of the vehicle light signaling control device is to be removed, according to a comparison result of the third resistance jump sequence and a preset fourth resistance jump sequence, where the preset fourth resistance jump sequence is a sequential jump sequence according to position resistances corresponding to one turn signaling on position, the turn signaling off position, and the other turn signaling on position.

Solution 14: The status detection device for a vehicle light signaling control device according to solution 13, where the third malfunction determining module is further configured to perform the following operation:

if the third resistance jump sequence is consistent with the fourth resistance jump sequence, determining that the malfunction of the vehicle light signaling control device is to be removed, and stopping sending the malfunction warning information; or if the third resistance jump sequence is inconsistent with the fourth resistance jump sequence, continuing outputting the malfunction warning information.

Solution 15: The status detection device for a vehicle light signaling control device according to solution 13, where the status detection device further includes an activation control module for the third malfunction determining module, where the activation control module for the third malfunction determining module is configured to: obtain the number of times it is determined that the vehicle light signaling control device has malfunctioned within a preset detection period; determine whether the number of times is greater than or equal to a preset threshold of times; and if the number of times is greater than or equal to the preset threshold of times, skip activating the third malfunction determining module; or if the number of times is less than the preset threshold of times, activate the third malfunction determining module.

Solution 16: The status detection device for a vehicle light signaling control device according to any one of solutions 9 to 12, where the preset position shifting sequence includes a sequence of shifting from the turn signaling off position to the turn signaling on position, and/or a sequence of shifting from the turn signaling on position to the turn signaling off position, and/or the preset position shifting sequence includes a sequential shifting sequence according to one turn signaling on position, the turn signaling off position, and the other turn signaling on position.

Solution 17: A status detection device for a vehicle light signaling control device, including a processor and a storage device adapted to store a plurality of program codes, where the program codes are adapted to be loaded and run by the processor to perform the status detection method for a vehicle light signaling control device according to any one of solutions 1 to 8.

Solution 18: A storage device having a plurality of program codes stored thereon, where the program codes are adapted to be loaded and run by a processor to perform the status detection method for a vehicle light signaling control device according to any one of solutions 1 to 8.

Solution 19: A vehicle, where the vehicle includes a vehicle light signaling control device and the status detection device for a vehicle light signaling control device according to any one of solutions 9 to 17;

the vehicle light signaling control device includes a turn position shifting module configured to perform on/off control on left turn signaling and right turn signaling by means of position shifting, and output a position resistance corresponding to a shifted position after the position shifting; and the status detection device is configured to determine whether the vehicle light signaling control device has malfunctioned, according to the position resistance output by the turn position shifting module.

The foregoing one or more technical solutions of the invention have at least one or more of the following beneficial effects:

During the implementation of the technical solutions of the invention, a normal resistance jump sequence during normal operation of the vehicle light signaling control device may be first obtained based on a position resistance corresponding to each position in the process of position shifting by the turn position shifting module during normal operation of the vehicle light signaling control device; then an actual resistance jump sequence is obtained based on a position resistance output by the turn position shifting module in practical applications; and finally a comparative analysis is performed on the normal resistance jump sequence and the actual resistance jump sequence. If the normal resistance jump sequence and the actual resistance jump sequence are consistent, it indicates that the vehicle light signaling control device has not malfunctioned; or if the normal resistance jump sequence and the actual resistance jump sequence are inconsistent, it indicates that the vehicle light signaling control device has malfunctioned. Specifically, after it is detected that the position resistance output by the turn position shifting module is a preset position resistance of a turn signaling on position or a preset position resistance of a turn signaling off position, a first resistance jump sequence (the actual resistance jump sequence) of a currently detected position resistance may be first obtained according to historical position resistance data and the currently detected position resistance; and then it is determined whether the vehicle light signaling control device has malfunctioned, according to a comparison result of the first resistance jump sequence and a preset second resistance jump sequence (the normal resistance jump sequence), where the preset second resistance jump sequence is a resistance jump sequence obtained according to a position resistance corresponding to each position in a preset position shifting sequence (a position shifting sequence of the turn position shifting module during normal operation of the vehicle light signaling control device).

By means of the foregoing steps, when it is detected that the position resistance output by the turn position shifting module falls into a resistance interval of a position resistance of a turn signaling on position or of the turn signaling off position, a position corresponding to this position resistance is not directly determined as the position of the turn position shifting module, but instead when a jump sequence of the position resistance is consistent with the normal resistance jump sequence, it is determined that an actual position of the turn position shifting module is the position corresponding to this position resistance, which overcomes a defect of false position determination by the light control lever in the prior art caused by the inconsistency between a position corresponding to a resistance value detection result of the light control lever and an actual position of the light control lever.

BRIEF DESCRIPTION OF THE DRAWINGS

Specific implementations of the invention are described below with reference to the accompanying drawings, in which.

LIST OF REFERENCE NUMERALS

Figure 1:
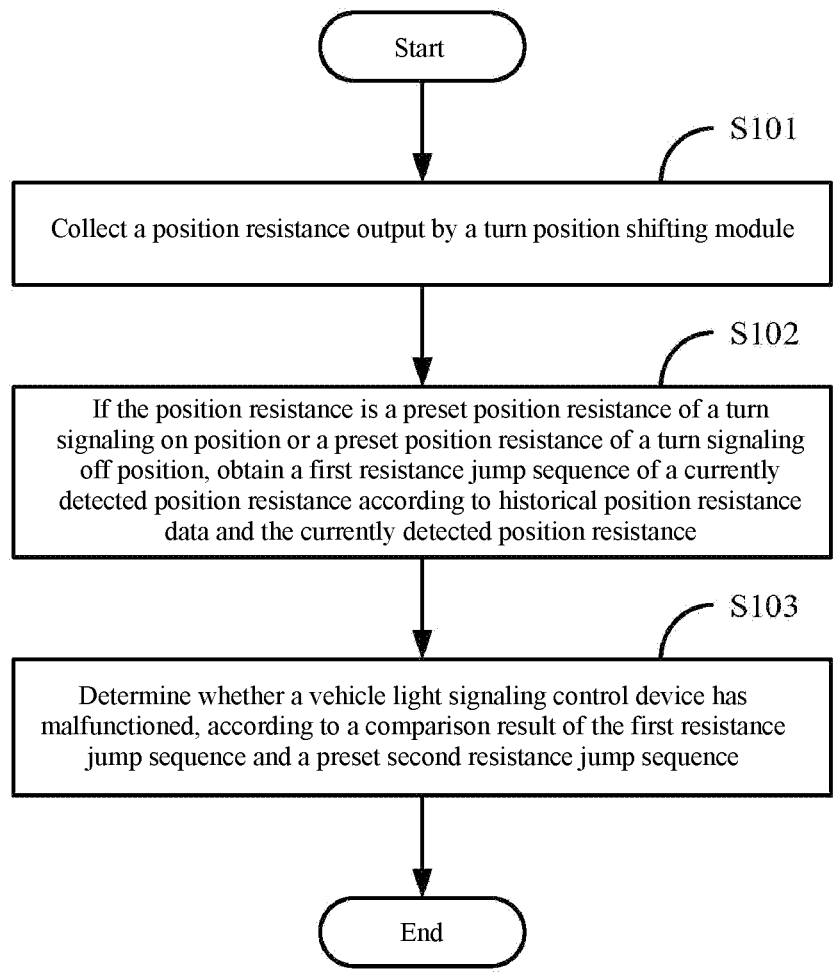
FIG. 1 is a schematic flowchart of main steps of a status detection method for a vehicle light signaling control device according to an embodiment of the invention.

11: resistance jump sequence obtaining module; and 12: first malfunction determining module.

DETAILED DESCRIPTION OF EMBODIMENTS

Some implementations of the invention are described below with reference to the accompanying drawings. Those skilled in the art should understand that these implementations are only used to explain the technical principles of the invention, and are not intended to limit the scope of protection of the invention.

In the description of the invention, a "module" and a "processor" may include hardware, software, or a combination thereof. A module may include a hardware circuit, various suitable sensors, a communication port, and a memory, or may include a software part, such as program code, or may be a combination of software and hardware. The processor may be a central processing unit, a microprocessor, a graphics processing unit, a digital signal processor, or any other suitable processor. The processor has a data and/or signal processing function. The processor may be implemented in software, hardware, or a combination thereof. A non-transitory computer-readable storage medium includes any suitable medium that can store program code, such as a magnetic disk, a hard disk, an optical disc, a flash memory, a read-only memory, or a random access memory. The term "A and/or B" indicates all possible combinations of A and B, for example, only A, only B, or A and B. The term "at least one of A or B" or "at least one of A and B" has a meaning similar to "A and/or B" and may include only A, only B, or A and B. The terms "a/an" and "this" in the singular form may also include the plural form.

Some terms involved in the invention are explained here first.

A vehicle light signaling control device is a device that can switch and control vehicle lights, such as a light control lever. The vehicle lights include but are not limited to: a left turn signal, a right turn signal, low beam lights, high beam lights, passing lights, fog lights, etc. In the embodiments of the invention, the vehicle light signaling control device may include a turn position shifting module, and the turn position shifting module may be configured to perform on/off control on left turn signaling (the left turn signal) and right turn signaling (the right turn signal) by means of position shifting, and output a position resistance corresponding to a shifted position after the position shifting. To be specific, when controlling left turn signaling to be switched on (for example, controlling the left turn signal to be switched on), controlling right turn signaling to be switched on (for example, controlling the right turn signal to be switched on), and controlling turn signaling to be switched off, the turn position shifting module outputs position resistances of different values, respectively. In an implementation, the turn position shifting module is provided with resistors having different resistance values, different positions are respectively connected to the resistors (position resistors) having different resistance values, and a corresponding position resistor may be connected after the position shifting, so that the turn position shifting module can output a corresponding position resistance.

A current conventional light control lever position detection method is mainly detecting a resistance value output by a light control lever, determining a resistance interval of which position the resistance value falls into, and determining a position of the light control lever according to a determination result. However, in practical applications, due to poor contact of electronic components (for example, gold fingers in a PCB board are not fixed and mounted firmly, resulting in poor contact between the gold fingers and the PCB board) and other factors, it may happen to the light control lever that although a resistance value of the light control lever is detected to fall into a resistance interval of a specific position, an actual position of the light control lever is different from this position. For example, the actual position of the light control lever is the left turn position (the left turn signal is switched on). A user does not shift a position, but it is detected that the resistance value of the light control lever falls into a resistance interval of the right turn position, which causes the right turn signal to be switched on, and consequently increases the driving risk of the vehicle.

In the embodiments of the invention, a normal resistance jump sequence during normal operation of the vehicle light signaling control device may be first obtained based on a position resistance corresponding to each position in the process of position shifting by the turn position shifting module during normal operation of the vehicle light signaling control device; then an actual resistance jump sequence is obtained based on a position resistance output by the turn position shifting module in practical applications; and finally a comparative analysis is performed on the normal resistance jump sequence and the actual resistance jump sequence. If the normal resistance jump sequence and the actual resistance jump sequence are consistent, it indicates that the vehicle light signaling control device has not malfunctioned; or if the normal resistance jump sequence and the actual resistance jump sequence are inconsistent, it indicates that the vehicle light signaling control device has malfunctioned. Specifically, in this embodiment of the invention, after it is detected that the position resistance output by the turn position shifting module is a preset position resistance of a turn signaling on position or a preset position resistance of a turn signaling off position, a first resistance jump sequence (the actual resistance jump sequence) of a currently detected position resistance may be first obtained according to historical position resistance data and the currently detected position resistance; and then it is determined whether the vehicle light signaling control device has malfunctioned, according to a comparison result of the first resistance jump sequence and a preset second resistance jump sequence (the normal resistance jump sequence), where the preset second resistance jump sequence is a resistance jump sequence obtained according to a position resistance corresponding to each position in a preset position shifting sequence (a position shifting sequence of the turn position shifting module during normal operation of the vehicle light signaling control device).

By means of the foregoing steps, when it is detected that the position resistance output by the turn position shifting module falls into a resistance interval of a position resistance of a turn signaling on position (for example, an on position for the right turn signal) or of the turn signaling off position, a position corresponding to this position resistance is not directly determined as the position of the turn position shifting module, but instead when a jump sequence of the position resistance is consistent with the normal resistance jump sequence, it is determined that an actual position of the turn position shifting module is the position corresponding to this position resistance (the turn position shifting module has not malfunctioned), which overcomes a defect of false position determination by the light control lever in the prior art caused by the inconsistency between a position corresponding to a resistance value detection result of the light control lever and an actual position of the light control lever.

Referring to FIG. 1, FIG. 1 is a schematic flowchart of main steps of a status detection method for a vehicle light signaling control device according to an embodiment of the invention. As shown in FIG. 1, the status detection method for a vehicle light signaling control device in this embodiment of the invention mainly includes the following steps.

Step S101: Collect a position resistance output by a turn position shifting module in the vehicle light signaling control device.

In this embodiment, specific structures/functions of the vehicle light signaling control device, the turn position shifting module, and the position resistance are the same as those of the vehicle light signaling control device, the turn position shifting module, and the position resistance in the foregoing term explanation. For brevity of description, details are not described herein again.

Step S102: If the position resistance is a preset position resistance of a turn signaling on position or a preset position resistance of a turn signaling off position, obtain a first resistance jump sequence of the position resistance according to historical position resistance data and the position resistance.

The turn signaling on position is a position for the turn position shifting module to control left turn signaling or right turn signaling to be switched on when performing on/off control on left turn signaling and right turn signaling by means of position shifting. If the position is shifted to a left turn signaling on position, the vehicle light signaling control device controls the vehicle to perform left turn signaling (for example, control a left turn signal to be switched on). If the position is shifted to a right turn signaling on position, the vehicle light signaling control device controls the vehicle to perform right turn signaling (for example, control a right turn signal to be switched on). The turn signaling off position is a position for the turn position shifting module to control left turn signaling and right turn signaling to be switched off when performing on/off control on left turn signaling and right turn signaling by means of position shifting.

The preset position resistance of the turn signaling on position is a position resistance that is output by the turn position shifting module and that is detected/obtained in advance after the position is shifted to the turn signaling on position (the left turn signaling on position and the right turn signaling on position) when the vehicle light signaling control device is in normal operation without malfunctioning. The preset position resistance of the turn signaling off position is a position resistance that is output by the turn position shifting module and that is detected/obtained in advance after the position is shifted to the turn signaling off position when the vehicle light signaling control device is in normal operation without malfunctioning.

Step S103: Determine whether the vehicle light signaling control device has malfunctioned, according to a comparison result of the first resistance jump sequence and a preset second resistance jump sequence.

The preset second resistance jump sequence is a resistance jump sequence obtained according to a position resistance corresponding to each position in a preset position shifting sequence (a position shifting sequence of the turn position shifting module during normal operation of the vehicle light signaling control device).

By means of the foregoing steps S101 to S103, in this embodiment of the invention, when it is detected that the position resistance output by the turn position shifting module falls into a resistance interval of a position resistance of a turn signaling on position (for example, an on position for the right turn signal) or of the turn signaling off position, a position corresponding to this position resistance is not directly determined as the position of the turn position shifting module, but instead when a jump sequence of the position resistance is consistent with the normal resistance jump sequence, it is determined that an actual position of the turn position shifting module is the position corresponding to this position resistance (the turn position shifting module has not malfunctioned), which overcomes a defect of false position determination by the light control lever in the prior art caused by the inconsistency between a position corresponding to a resistance value detection result of the light control lever and an actual position of the light control lever.

The foregoing steps S102 and S103 are further described below.

In an optional implementation of step S102 in this embodiment of the invention, the first resistance jump sequence of the position resistance may be obtained according to the following steps.

Step S1021: Obtain, according to the historical position resistance data, a position resistance output by the turn position shifting module before the position resistance jumps to the currently detected position resistance.

Step S1022: Obtain the first resistance jump sequence according to the position resistance obtained in step S1021 (the position resistance output by the turn position shifting module before the position resistance jumps to the currently detected position resistance) and the currently detected position resistance.

As an example, if the "currently detected position resistance" is the position resistance $R_{left}$ of the left turn signaling on position, and the "position resistance output by the turn position shifting module before the position resistance jumps to the currently detected position resistance" is the position resistance $R_{right}$ of the right turn signaling on position, the first resistance jump sequence of the "currently detected position resistance" is: a sequence of jumping from $R_{left}$ to $R_{right}$ ($R_{left} \rightarrow R_{right}$).

In this implementation, immediately after the position resistance output by the turn position shifting module is collected, the collected resistance may be stored to form the historical position resistance data, so that the first resistance jump sequence of the position resistance can be quickly and accurately analyzed according to the historical position resistance data, which facilitates an accurate status analysis for the vehicle light signaling control device.

In an optional implementation of step S103 in this embodiment of the invention, whether the vehicle light signaling control device has malfunctioned may be determined according to the following step: if the first resistance jump sequence is consistent with the preset second resistance jump sequence, determining that the vehicle light signaling control device has not malfunctioned; or if the first resistance jump sequence is inconsistent with the second resistance jump sequence, determining that the vehicle light signaling control device has malfunctioned, and outputting malfunction warning information.

In an implementation, if parameters $R_{left}$, $R_{right}$, and $R_{off}$ are used to represent the position resistance of the left turn signaling on position, the position resistance of the right turn signaling on position, and the position resistance of the turn signaling off position, respectively, the preset second resistance jump sequence may include a first jump sequence and a second jump sequence, where the first jump sequence is a sequential jump sequence of position resistances according to $R_{left}$, $R_{off}$, and $R_{right}$ ($R_{left} \rightarrow R_{off} \rightarrow R_{right}$), and the second jump sequence is a sequential jump sequence of position resistances according to $R_{right}$, $R_{off}$, and $R_{left}$ ($R_{right} \rightarrow R_{off} \rightarrow R_{left}$). In this implementation, if the first resistance jump sequence is consistent with either of the first jump sequence and the second jump sequence, it is determined that the first resistance jump sequence is consistent with the preset second resistance jump sequence. If the first resistance jump sequence is inconsistent with neither of the first jump sequence and the second jump sequence, it is determined that the first resistance jump sequence is inconsistent with the preset second resistance jump sequence.

In an implementation, if parameters $R_{left}$, $R_{right}$, and $R_{off}$ are used to represent the position resistance of the left turn signaling on position, the position resistance of the right turn signaling on position, and the position resistance of the turn signaling off position, respectively, the preset second resistance jump sequence may include a third jump sequence and a fourth jump sequence, where the third jump sequence is a sequential jump sequence of position resistances according to $R_{off}$ and $R_{left}$ ($R_{off} \rightarrow R_{left}$), and the fourth jump sequence is a sequential jump sequence of position resistances according to $R_{off}$ and $R_{right}$ ($R_{off} \rightarrow R_{right}$). In this implementation, if the first resistance jump sequence is consistent with either of the third jump sequence and the fourth jump sequence, it is determined that the first resistance jump sequence is consistent with the preset second resistance jump sequence. If the first resistance jump sequence is inconsistent with neither of the third jump sequence and the fourth jump sequence, it is determined that the first resistance jump sequence is inconsistent with the preset second resistance jump sequence.

In an implementation, if parameters $R_{left}$, $R_{right}$, and $R_{off}$ are used to represent the position resistance of the left turn signaling on position, the position resistance of the right turn signaling on position, and the position resistance of the turn signaling off position, respectively, the preset second resistance jump sequence may include a fifth jump sequence and a sixth jump sequence, where the fifth jump sequence is a sequential jump sequence of position resistances according to $R_{left}$ and $R_{off}$ ($R_{left} \rightarrow R_{off}$), and the sixth jump sequence is a sequential jump sequence of position resistances according to $R_{right}$ and $R_{off}$ ($R_{right} \rightarrow R_{off}$). In this implementation, if the first resistance jump sequence is consistent with either of the fifth jump sequence and the sixth jump sequence, it is determined that the first resistance jump sequence is consistent with the preset second resistance jump sequence. If the first resistance jump sequence is inconsistent with neither of the fifth jump sequence and the sixth jump sequence, it is determined that the first resistance jump sequence is inconsistent with the preset second resistance jump sequence.

It can be known based on the foregoing term explanation that, the turn position shifting module may be configured to output a position resistance corresponding to a shifted position after the position shifting. To be specific, when controlling left turn signaling to be switched on (for example, controlling the left turn signal to be switched on), controlling right turn signaling to be switched on (for example, controlling the right turn signal to be switched on), and controlling turn signaling to switched off, the turn position shifting module outputs position resistances of different values, respectively. If it is determined that the position resistance is neither the preset position resistance of the turn signaling on position nor the preset position resistance of the turn signaling off position, it can be determined that this position resistance may be inconsistent with the respective position resistances of all the positions ($R_{left}$, $R_{right}$, and $R_{off}$) because the vehicle light signaling control device has malfunctioned.

Status detection may be performed on the vehicle light signaling control device according to the implementation described in the foregoing steps S101 to S103. Alternatively, in an implementation, whether there is an abnormal case in which the position resistance output by the turn position shifting module after the position shifting is inconsistent with the respective position resistances of all the positions may be detected, and whether the vehicle turn signaling control device has malfunctioned is determined according to a detection result. Specifically, the status detection method for a vehicle turn signaling control device shown in FIG. 1 may further include step S104. In this implementation, step S104 mainly includes: determining whether the position resistance output by the turn position shifting module is a preset abnormal resistance; and if the position resistance output by the turn position shifting module is a preset abnormal resistance, determining that the vehicle light signaling control device has malfunctioned, and outputting malfunction warning information, where the preset abnormal resistance includes a resistance value other than the preset position resistance ($R_{left}$ or $R_{right}$) of the turn signaling on position and the preset position resistance ($R_{off}$) of the turn signaling off position, that is, a resistance value inconsistent with the respective position resistances of all the positions. In an implementation, step S104 may be performed before step S101; and if it is determined in step S104 that the vehicle light signaling control device has not malfunctioned, step S101 is then performed; or if it is determined that the vehicle light signaling control device has malfunctioned, the malfunction warning information is output directly, and the subsequent steps S101 to S103 are not performed.

Further, in this embodiment of the invention, after it is determined that the vehicle light signaling control device has malfunctioned, whether the malfunction of the vehicle light signaling control device is to be removed may further be determined by means of a resistance jump sequence comparison. Specifically, in an implementation, after step S102 and/or step S103 and/or step S104, step S105 of determining whether the malfunction is to be removed may further be included. In this implementation, step S105 may specifically include the following:

Step S1051: Collect a position resistance output by the turn position shifting module, and obtain a third resistance jump sequence of the position resistance based on a collection result.

In this implementation, the third resistance jump sequence may be obtained according to the following steps:

after it is determined that the vehicle light signaling control device has malfunctioned, collecting the position resistance output by the turn position shifting module, obtaining resistance values before and after each position resistance jump based on a collection result, and obtaining the third resistance jump sequence based on each resistance value obtained. As an example, after it is determined that the vehicle light signaling control device has malfunctioned, it is detected that the position resistance has two jumps, and according to a collection result of position resistances, position resistances before and after the first jump are $R_{left}$ and $R_{off}$, and position resistances before and after the second jump are $R_{off}$ and $R_{right}$. In this case, it can be concluded that the third resistance jump sequence is a sequential jump sequence according to $R_{left}$, $R_{off}$, and $R_{right}$ ($R_{left} \rightarrow R_{off} \rightarrow R_{right}$). $R_{left}$, $R_{off}$, and $R_{right}$ represent the position resistance of the left turn signaling on position, the position resistance of the right turn signaling on position, and the position resistance of the turn signaling off position, respectively.

Step S1052: Determine whether the malfunction of the vehicle light signaling control device is to be removed, according to a comparison result of the third resistance jump sequence and a preset fourth resistance jump sequence.

The preset fourth resistance jump sequence is a sequential jump sequence according to position resistances corresponding to one turn signaling on position, the turn signaling off position, and the other turn signaling on position. If "one turn signaling on position" is the left turn signaling on position, "the other turn signaling on position" may be the right turn signaling on position. If "one turn signaling on position" is the right turn signaling on position, "the other turn signaling on position" may be the left turn signaling on position.

If parameters $R_{left}$, $R_{right}$, and $R_{off}$ are used to represent the position resistance of the left turn signaling on position, the position resistance of the right turn signaling on position, and the position resistance of the turn signaling off position, respectively, the preset fourth resistance jump sequence may include a seventh jump sequence and an eighth jump sequence, where the seventh jump sequence is a sequential jump sequence of position resistances according to $R_{left}$, $R_{off}$, and $R_{right}$ ($R_{left} \rightarrow R_{off} \rightarrow R_{right}$), and the eighth jump sequence is a sequential jump sequence of position resistances according to $R_{right}$, $R_{off}$, and $R_{left}$ ($R_{right} \rightarrow R_{off} \rightarrow R_{left}$). In this implementation, if the third resistance jump sequence is consistent with either of the seventh jump sequence and the eighth jump sequence, it is determined that the third resistance jump sequence is consistent with the preset fourth resistance jump sequence. If the third resistance jump sequence is inconsistent with neither of the seventh jump sequence and the eighth jump sequence, it is determined that the third resistance jump sequence is inconsistent with the preset fourth resistance jump sequence.

In this implementation, if the third resistance jump sequence is consistent with the preset fourth resistance jump sequence, it may be determined that the malfunction of the vehicle light signaling control device is to be removed, and the malfunction warning information stops being sent; or if the third resistance jump sequence is inconsistent with the fourth resistance jump sequence, the malfunction warning information continues being output.

In this embodiment of the invention, if it is detected within a specific period of time that the vehicle light signaling control device malfunctions multiple times, it can be determined that the vehicle light signaling control device may have a relatively severe malfunction, such as a malfunction that cannot be overcome by means of automatic adjustment of the device. Therefore, before the malfunction removal determining step is performed, the number of times the vehicle light signaling control device malfunctions may be obtained, and whether the vehicle light signaling control device has a relatively severe malfunction may be determined based on the number of times. Then, whether the malfunction removal determining step needs to be performed is determined. Specifically, in an implementation, before step S105, the following steps may be performed: obtaining the number of times it is determined that the vehicle light signaling control device has malfunctioned within a preset detection period (e.g. 1 min); determining whether the number of times is greater than or equal to a preset threshold of times (e.g. 3); and if the number of times is greater than or equal to the preset threshold of times, skipping the malfunction removal determining step (step S105); or if the number of times is less than the preset threshold of times, performing the malfunction removal determining step (step S105).

It should be noted that although the steps are described in a specific order in the foregoing embodiment, those skilled in the art can understand that in order to achieve the effects of the invention, different steps are not necessarily performed in this order, but may be performed simultaneously (in parallel) or in another order, and these variations all fall within the scope of protection of the invention.

Figure 2:
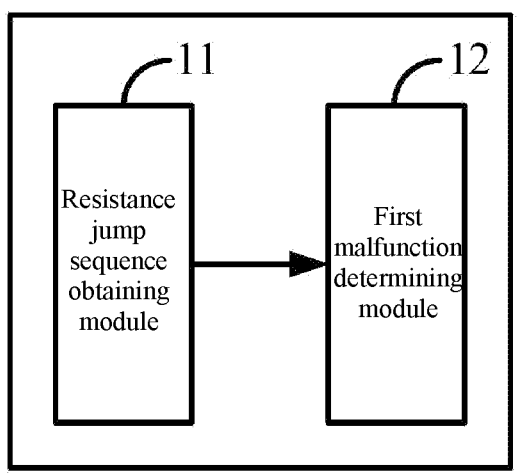
FIG. 2 is a block diagram of a main structure of a status detection device for a vehicle light signaling control device according to an embodiment of the invention.

Further, the invention further provides an embodiment of a status detection device for a vehicle light signaling control device. Referring to FIG. 2, FIG. 2 is a block diagram of a main structure of a status detection device for a vehicle light signaling control device according to an embodiment of the invention. As shown in FIG. 2, the status detection device for a vehicle light signaling control device in this embodiment of the invention mainly includes a resistance jump sequence obtaining module 11 and a first malfunction determining module 12. In some embodiments, the resistance jump sequence obtaining module 11 and the first malfunction determining module 12 may be combined into one module. In some embodiments, the resistance jump sequence obtaining module 11 may be configured to: after it is detected that a position resistance output by a turn position shifting module is a preset position resistance of a turn signaling on position or a preset position resistance of a turn signaling off position, obtain a first resistance jump sequence of a currently detected position resistance according to historical position resistance data and the currently detected position resistance. The first malfunction determining module 12 may be configured to determine whether the vehicle light signaling control device has malfunctioned, according to a comparison result of the first resistance jump sequence and a preset second resistance jump sequence, where the preset second resistance jump sequence is a resistance jump sequence obtained according to a position resistance corresponding to each position in a preset position shifting sequence. The vehicle light signaling control device is the same as the vehicle light signaling control device described in the foregoing method embodiment. For brevity of description, the function/structure of the vehicle light signaling control device is not described herein again. In an implementation, for the detailed description of function implementation, reference may be made to the descriptions of steps S101 to S103.

In an implementation, the resistance jump sequence obtaining module 11 may be further configured to perform the following operations: obtaining, according to the historical position resistance data, a position resistance output by the turn position shifting module before the position resistance jumps to the currently detected position resistance; and obtaining the first resistance jump sequence according to the obtained position resistance and the currently detected position resistance. In an implementation, for the detailed description of function implementation, reference may be made to the description of step S102.

In an implementation, the first malfunction determining module 12 may be further configured to perform the following operation: if the first resistance jump sequence is consistent with the second resistance jump sequence, determining that the vehicle light signaling control device has not malfunctioned; or if the first resistance jump sequence is inconsistent with the second resistance jump sequence, determining that the vehicle light signaling control device has malfunctioned, and outputting malfunction warning information. In an implementation, for the detailed description of function implementation, reference may be made to the description of step S103.

In an implementation, the status detection device for a vehicle light signaling control device shown in FIG. 2 may further include a second malfunction determining module. In this implementation, the second malfunction determining module may be configured to: determine whether the position resistance output by the turn position shifting module is a preset abnormal resistance; and if the position resistance output by the turn position shifting module is a preset abnormal resistance, determine that the vehicle light signaling control device has malfunctioned, and output malfunction warning information. The preset abnormal resistance includes a resistance value other than the preset position resistance of the turn signaling on position and the preset position resistance of the turn signaling off position. In an implementation, for the detailed description of function implementation, reference may be made to the description of step S104.

In an implementation, the status detection device for a vehicle light signaling control device shown in FIG. 2 may further include a third malfunction determining module. In this implementation, the third malfunction determining module may be configured to: after the first malfunction determining module or the second malfunction determining module determines that the vehicle light signaling control device has malfunctioned, perform the following operations:

collecting a position resistance output by the turn position shifting module, and obtaining a third resistance jump sequence of the position resistance based on a collection result; and determining whether the malfunction of the vehicle light signaling control device is to be removed, according to a comparison result of the third resistance jump sequence and a preset fourth resistance jump sequence. The preset fourth resistance jump sequence is a sequential jump sequence according to position resistances corresponding to one turn signaling on position, the turn signaling off position, and the other turn signaling on position. In an implementation, for the detailed description of function implementation, reference may be made to the description of step S105.

In an implementation, the third malfunction determining module may be further configured to perform the following operation: if the third resistance jump sequence is consistent with the fourth resistance jump sequence, determining that the malfunction of the vehicle light signaling control device is to be removed, and stopping sending the malfunction warning information; or if the third resistance jump sequence is inconsistent with the fourth resistance jump sequence, continuing outputting the malfunction warning information. In an implementation, for the detailed description of function implementation, reference may be made to the description of step S105.

In an implementation, the status detection device for a vehicle light signaling control device may further include an activation control module for the third malfunction determining module. In this implementation, the activation control module for the third malfunction determining module may be configured to: obtain the number of times it is determined that the vehicle light signaling control device has malfunctioned within a preset detection period; determine whether the number of times is greater than or equal to a preset threshold of times; and if the number of times is greater than or equal to the preset threshold of times, skip activating the third malfunction determining module; or if the number of times is less than the preset threshold of times, activate the third malfunction determining module. In an implementation, for the detailed description of function implementation, reference may be made to the description of step S105.

The foregoing status detection device for a vehicle light signaling control device is used to implement the embodiment of the status detection method for a vehicle light signaling control device as shown in FIG. 1, and the technical principles, technical problems to be solved, and technical effects produced thereof are similar. Those skilled in the art can clearly understand that for convenience and brevity of description, for the specific working process and related description of the status detection device for a vehicle light signaling control device, reference may be made to the description of the embodiment of the status detection method for a vehicle light signaling control device. Details are not described herein again.

Those skilled in the art can understand that some or all of the procedures of the invention in the method of the foregoing embodiment may also be implemented by a computer program instructing relevant hardware. The computer program may be stored in a computer-readable storage medium. The computer program, when executed by a processor, may implement the steps of the foregoing method embodiments. The computer program includes computer program code, and the computer program code may be in the form of source code, object code, executable file, or some intermediate forms. The computer-readable medium may include: any entity or device, medium, USB flash disk, removable hard disk, magnetic disk, optical disc, computer memory, read-only memory, random access memory, electrical carrier signal, telecommunications signal, software distribution medium, etc. that can carry the computer program code. It should be noted that the content included in the computer-readable medium can be appropriately added or deleted depending on requirements of the legislation and patent practice in a jurisdiction. For example, in some jurisdictions, according to the legislation and patent practice, the computer-readable medium does not include an electrical carrier signal and a telecommunications signal.

Further, the invention further provides a storage device. In an embodiment of the storage device according to the invention, the storage device may be configured to store a program that executes the status detection method for a vehicle light signaling control device in the foregoing method embodiment, and the program may be loaded and run by a processor to implement the foregoing status detection method for a vehicle light signaling control device. For ease of description, only parts related to the embodiment of the invention are shown. For specific technical details that are not disclosed, refer to the method part of the embodiments of the invention. The storage device may be a storage device formed by various electronic devices. Optionally, the storage in this embodiment of the invention is a non-transitory computer-readable storage medium.

Further, the invention further provides a status detection device for a vehicle light signaling control device. In an embodiment of the status detection device for a vehicle light signaling control device according to the invention, the status detection device may include a processor and a storage device, the storage device may be configured to store a program that executes the status detection method for a vehicle light signaling control device in the foregoing method embodiment, and the processor may be configured to execute the program in the storage device. The program includes, but is not limited to, the program that executes the status detection method for a vehicle light signaling control device in the foregoing method embodiment. For ease of description, only parts related to the embodiment of the invention are shown. For specific technical details that are not disclosed, refer to the method part of the embodiments of the invention. The control device may be a control device formed by various electronic devices.

Further, the invention further provides a vehicle. In a vehicle embodiment according to the invention, the vehicle may include a vehicle light signaling control device and the status detection device for a vehicle light signaling control device according to the foregoing status detection device embodiment. In this embodiment, the vehicle light signaling control device may include a turn position shifting module, and the turn position shifting module may be configured to perform on/off control on left turn signaling and right turn signaling by means of position shifting, and output a position resistance corresponding to a shifted position after the position shifting. The status detection device may configured to determine whether the vehicle light signaling control device has malfunctioned, according to the position resistance output by the turn position shifting module. It should be noted that the turn position shifting module in this embodiment is the same as the turn position shifting module described in the foregoing method embodiment. For brevity of description, details are not described herein again.

Further, it should be understood that, since the configuration of the modules is merely intended to illustrate functional units of a system of the invention, a physical device corresponding to these modules may be a processor itself, or part of software, part of hardware, or part of a combination of software and hardware in the processor. Therefore, the number of modules in the figure is merely illustrative.

Those skilled in the art can understand that the modules in the system may be adaptively split or combined. Such a split or combination of specific modules does not cause the technical solutions to depart from the principle of the invention. Therefore, the technical solutions after the split or combination will all fall within the scope of protection of the invention.

Heretofore, the technical solutions of the invention have been described with reference to an embodiment as shown in the accompanying drawings. However, it would have been readily understood by those skilled in the art that the scope of protection of the invention is obviously not limited to these specific embodiments. Those skilled in the art could make equivalent changes or substitutions to the related technical features without departing from the principles of the invention, and all the technical solutions after the changes or the substitutions fall within the scope of protection of the invention.

The invention claimed is:

1. A status detection method for a vehicle light signaling control device, the status detection method is implemented by a status detection device for a light signaling control device, the status detection method comprises:
   performing, by a turn position shifting module, on/off control on left turn signaling and right turn signaling by position shifting, and outputting, by the turn position shift module, a position resistance corresponding to a shifted position after the position shifting;
   after it is detected that the position resistance output by the turn position shifting module is a preset position resistance of a turn signaling on position or a preset position resistance of a turn signaling off position, obtaining a first resistance jump sequence of a currently detected position resistance according to historical position resistance data and the currently detected position resistance; and
   determining whether the vehicle light signaling control device has malfunctioned, according to a comparison result of the first resistance jump sequence and a preset second resistance jump sequence,
   wherein the preset second resistance jump sequence is a resistance jump sequence obtained according to a position resistance corresponding to each position in a preset position shifting sequence,
   wherein the vehicle light signaling control device comprises the turn position shifting module.

2. The status detection method for a vehicle light signaling control device according to claim 1, wherein the step of the obtaining a first resistance jump sequence of a currently detected position resistance according to historical position resistance data and the currently detected position resistance specifically comprises:
   obtaining, according to the historical position resistance data, a position resistance output by the turn position shifting module before the position resistance jumps to the currently detected position resistance; and
   obtaining the first resistance jump sequence according to the obtained position resistance and the currently detected position resistance.

3. The status detection method for a vehicle light signaling control device according to claim 1, wherein the step of the determining whether the vehicle light signaling control device has malfunctioned, according to a comparison result of the first resistance jump sequence and a preset second resistance jump sequence specifically comprises:
   if the first resistance jump sequence is consistent with the second resistance jump sequence, determining that the vehicle light signaling control device has not malfunctioned; or
   if the first resistance jump sequence is inconsistent with the second resistance jump sequence, determining that the vehicle light signaling control device has malfunctioned, and outputting malfunction warning information.

4. The status detection method for a vehicle light signaling control device according to claim 3, wherein after the determining that the vehicle light signaling control device has malfunctioned, the method further comprises a malfunction removal determining step, and the malfunction removal determining step specifically comprises:
   collecting a position resistance output by the turn position shifting module, and obtaining a third resistance jump sequence of the position resistance based on a collection result; and
   determining whether the malfunction of the vehicle light signaling control device is to be removed, according to a comparison result of the third resistance jump sequence and a preset fourth resistance jump sequence,
   wherein the preset fourth resistance jump sequence is a sequential jump sequence according to position resistances corresponding to one turn signaling on position, the turn signaling off position, and the other turn signaling on position.

5. The status detection method for a vehicle light signaling control device according to claim 4, wherein the step of the determining whether the malfunction of the vehicle light signaling control device is to be removed, according to a comparison result of the third resistance jump sequence and a preset fourth resistance jump sequence specifically comprises:
   if the third resistance jump sequence is consistent with the fourth resistance jump sequence, determining that the malfunction of the vehicle light signaling control device is to be removed, and stopping sending the malfunction warning information; or if the third resistance jump sequence is inconsistent with the fourth resistance jump sequence, continuing outputting the malfunction warning information.

6. The status detection method for a vehicle light signaling control device according to claim 4, wherein before the malfunction removal determining step is performed, the method further comprises:
   obtaining the number of times it is determined that the vehicle light signaling control device has malfunctioned within a preset detection period;

determining whether the number of times is greater than or equal to a preset threshold of times; and if the number of times is greater than or equal to the preset threshold of times, skipping the malfunction removal determining step; or if the number of times is less than the preset threshold of times, performing the malfunction removal determining step.

7. The status detection method for a vehicle light signaling control device according to claim 1, wherein the method further comprises:

determining whether the position resistance output by the turn position shifting module is a preset abnormal resistance; and if the position resistance output by the turn position shifting module is a preset abnormal resistance, determining that the vehicle light signaling control device has malfunctioned, and outputting malfunction warning information, wherein the preset abnormal resistance comprises a resistance value other than the preset position resistance of the turn signaling on position and the preset position resistance of the turn signaling off position.

8. The status detection method for a vehicle light signaling control device according to claim 1, wherein the preset position shifting sequence comprises a sequence of shifting from the turn signaling off position to the turn signaling on position, and/or a sequence of shifting from the turn signaling on position to the turn signaling off position, and/or the preset position shifting sequence comprises a sequential shifting sequence according to one turn signaling on position, the turn signaling off position, and the other turn signaling on position.

9. A status detection device for a vehicle light signaling control device, the status detection device comprises:

a resistance jump sequence obtaining module configured to: after it is detected that the position resistance output by the turn position shifting module is a preset position resistance of a turn signaling on position or a preset position resistance of a turn signaling off position, obtain a first resistance jump sequence of a currently detected position resistance according to historical position resistance data and the currently detected position resistance; and a first malfunction determining module configured to determine whether the vehicle light signaling control device has malfunctioned, according to a comparison result of the first resistance jump sequence and a preset second resistance jump sequence, wherein the preset second resistance jump sequence is a resistance jump sequence obtained according to a position resistance corresponding to each position in a preset position shifting sequence, wherein the vehicle light signaling control device comprises a turn position shifting module configured to perform on/off control on left turn signaling and right turn signaling by position shifting, and output a position resistance corresponding to a shifted position after the position shifting.

10. The status detection device for a vehicle light signaling control device according to claim 9, wherein the resistance jump sequence obtaining module is further configured to perform the following operations:

obtaining, according to the historical position resistance data, a position resistance output by the turn position shifting module before the position resistance jumps to the currently detected position resistance; and obtaining the first resistance jump sequence according to the obtained position resistance and the currently detected position resistance.

* * * * *

UNITED STATES PATENT AND TRADEMARK OFFICE
CERTIFICATE OF CORRECTION

| | | |
|---|---|---|
| PATENT NO. | : 12,077,099 B2 | Page 1 of 1 |
| APPLICATION NO. | : 17/487077 | |
| DATED | : September 3, 2024 | |
| INVENTOR(S) | : Jiawen Zheng et al. | |

It is certified that error appears in the above-identified patent and that said Letters Patent is hereby corrected as shown below:

In the Claims

In Claim 1, Column 21, Line 40, delete "device for a light signaling", and insert --device for a vehicle light signaling--

Signed and Sealed this
Eleventh Day of March, 2025

Coke Morgan Stewart
*Acting Director of the United States Patent and Trademark Office*